(12) United States Patent
Haslbeck et al.

(10) Patent No.: US 9,685,593 B2
(45) Date of Patent: Jun. 20, 2017

(54) HOUSING FOR A SEMICONDUCTOR CHIP, HOUSING COMPOSITE, SEMICONDUCTOR COMPONENT AND METHOD OF PRODUCING A SEMICONDUCTOR COMPONENT

(71) Applicant: OSRAM Opto Semiconductors GmbH, Regensburg (DE)

(72) Inventors: Stephan Haslbeck, Regensburg (DE); Martin Haushalter, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/036,465

(22) PCT Filed: Nov. 13, 2014

(86) PCT No.: PCT/EP2014/074516
§ 371 (c)(1),
(2) Date: May 13, 2016

(87) PCT Pub. No.: WO2015/074951
PCT Pub. Date: May 28, 2015

(65) Prior Publication Data
US 2016/0293804 A1    Oct. 6, 2016

(30) Foreign Application Priority Data
Nov. 25, 2013   (DE) .................. 10 2013 113 009

(51) Int. Cl.
*H01L 29/22*    (2006.01)
*H01L 33/48*    (2010.01)
*H01L 33/62*    (2010.01)

(52) U.S. Cl.
CPC ............ *H01L 33/486* (2013.01); *H01L 33/62* (2013.01); *H01L 2224/48091* (2013.01); *H01L 2224/48465* (2013.01); *H01L 2224/73265* (2013.01); *H01L 2933/0033* (2013.01)

(58) Field of Classification Search
CPC ......... C09K 11/06; H01L 51/56; H01L 43/08; H01L 43/12; H01L 51/5253
USPC ........................................... 257/99
See application file for complete search history.

(56) References Cited

U.S. PATENT DOCUMENTS

| | | | |
|---|---|---|---|
| 4,047,242 A | 9/1977 | Jakob et al. | |
| 5,866,818 A * | 2/1999 | Sumi ....................... | G01P 1/023 73/493 |
| 6,115,261 A | 9/2000 | Platt et al. | |
| 6,796,027 B2 | 9/2004 | Suzuki et al. | |
| 7,495,322 B2 | 2/2009 | Hashimoto et al. | |

(Continued)

FOREIGN PATENT DOCUMENTS

| | | |
|---|---|---|
| DE | 25 30 157 A1 | 2/1977 |
| EP | 0 777 124 A1 | 6/1997 |

(Continued)

*Primary Examiner* — Andy Huynh
(74) *Attorney, Agent, or Firm* — DLA Piper LLP (US)

(57) ABSTRACT

A housing for a semiconductor chip has a front side and a rear side opposite the front side, wherein the front side has a fastening area for the semiconductor chip; the rear side has a mounting area to mount the housing, wherein the mounting area runs obliquely to the fastening area; and the rear side has a resting area running parallel to the fastening area.

15 Claims, 3 Drawing Sheets

(56) References Cited

U.S. PATENT DOCUMENTS

| | | | |
|---|---|---|---|
| 2005/0245018 A1* | 11/2005 | Bogner | H01L 33/486 438/200 |
| 2009/0050907 A1* | 2/2009 | Yuan | H05B 33/0821 257/88 |
| 2009/0262516 A1* | 10/2009 | Li | H01L 33/56 362/84 |
| 2010/0032189 A1 | 2/2010 | Muto et al. | |
| 2012/0322178 A1* | 12/2012 | Guenther | H01L 24/24 438/26 |
| 2013/0032701 A1 | 2/2013 | Chen et al. | |

FOREIGN PATENT DOCUMENTS

| | | |
|---|---|---|
| EP | 1 632 711 A2 | 3/2006 |
| JP | 2006-93359 A | 4/2006 |
| JP | 2012-119403 A | 6/2012 |

* cited by examiner

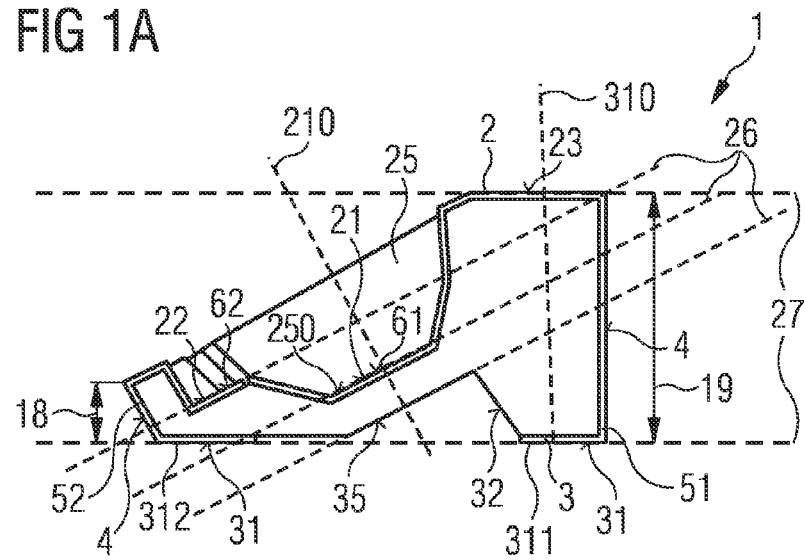
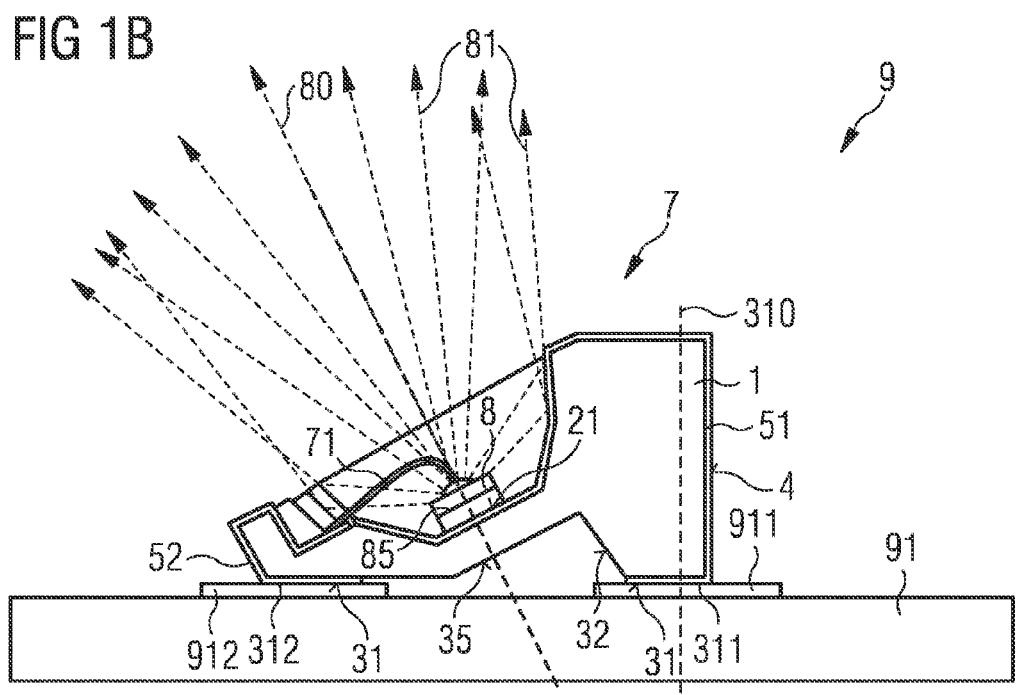

HOUSING FOR A SEMICONDUCTOR CHIP, HOUSING COMPOSITE, SEMICONDUCTOR COMPONENT AND METHOD OF PRODUCING A SEMICONDUCTOR COMPONENT

TECHNICAL FIELD

This disclosure relates to a housing for a semiconductor chip, a housing composite with a plurality of such housings, a semiconductor component as well as a method of producing a semiconductor component.

BACKGROUND

Surface-mounted semiconductor components such as light-emitting diodes typically radiate mainly perpendicular to the mounting plane of the components. Furthermore, components are known which radiate parallel to the mounting plane. These types of structures are also referred to as Top-Looker or Side-Looker, respectively. However, various applications require mainly oblique radiation.

It could therefore be helpful to provide radiation at a predetermined angle in a simple and reliable manner.

SUMMARY

We provide a housing for a semiconductor chip having a front side and a rear side opposite the front side, wherein the front side has a fastening area for the semiconductor chip; the rear side has a mounting area to mount the housing, wherein the mounting area runs obliquely to the fastening area; and the rear side has a resting area running parallel to the fastening area.

We also provide a semiconductor component including the housing and a semiconductor chip fastened to the fastening area.

We further provide a component composite including at least one semiconductor component and a connection carrier, wherein the semiconductor component is fastened to the connection carrier on the side of the mounting area.

We yet further provide a method of producing a semiconductor component including providing the housing; arranging the housing on a mount so that the housing rests on the resting area; and fastening a semiconductor chip to the fastening area.

We still further provide a semiconductor component including a housing and a semiconductor chip, wherein the semiconductor chip is an optoelectronic semiconductor chip that generates radiation having a main radiation direction or receives radiation having a main detection direction; the housing has a front side and a rear side opposite the front side; the front side has a fastening area, the semiconductor chip being fastened to the fastening area; the rear side has a mounting area to mount the housing, wherein the mounting area runs oblique to the fastening area; the rear side has a resting area running parallel to the fastening area; and the main radiation direction or the main detection direction of the runs perpendicular to the fastening area and oblique to the mounting area.

BRIEF DESCRIPTION OF THE DRAWINGS

FIG. 1A shows an example of a housing in a schematic sectional view.

FIG. 1B shows an example of a component arrangement having a semiconductor component in a schematic sectional view.

DETAILED DESCRIPTION

Figure 2A:
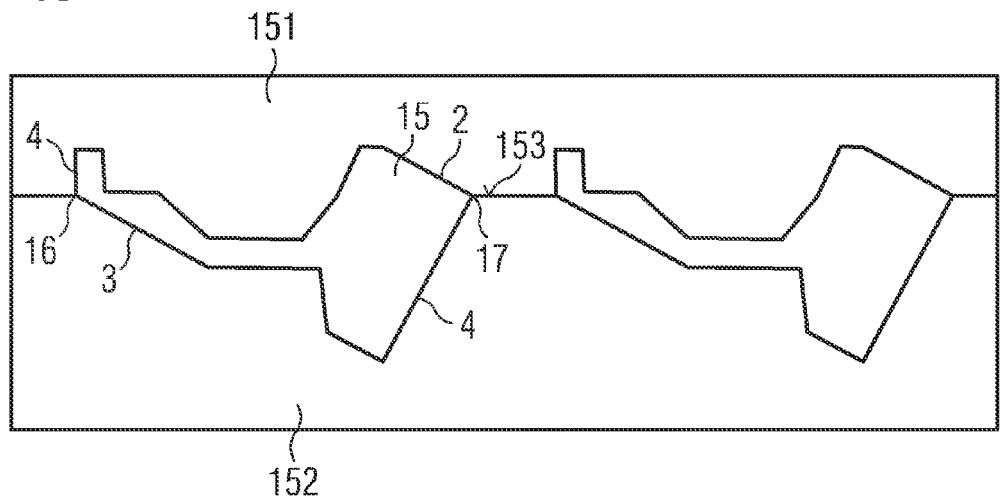
FIG. 2A shows an example of an intermediate step of producing a housing in a schematic sectional view.

We provide a housing for a semiconductor chip, particularly an optoelectronic semiconductor chip. The housing may have a front side and a rear side opposite the front side. The front side is particularly considered to be the side of the housing provided to fasten a semiconductor chip. The rear side is particularly provided for the fastening of the housing, e.g., to a connection carrier.

In particular, the housing is provided as a housing for a surface-mounted device (Surface Mounted Device, SMD).

For example, the housing has a shaped body such as a plastic shaped body. The shaped body is produced by a casting method, for example.

A casting method is generally considered to be a method by which molding material can be formed according to a predetermined shape and subsequently hardened, if required. In particular, the term refers to casting, injection molding, transfer molding and compression molding.

The front side may comprise a fastening area for the semiconductor chip. In particular, the fastening area is a flat area of the front side to which the semiconductor chip can be fastened by a connection layer, for example, an adhesion layer or a solder layer. In addition to a mechanic connection, the fastening area may also be configured for an electric connection to the semiconductor chip.

The rear side may have a mounting area to mount the housing. When fastening the housing to a connection carrier, the mounting area faces the connection carrier and runs particularly parallel to a main extension plane of the connection carrier. In particular, the mounting area runs obliquely to the fastening area. That means it neither runs perpendicular nor parallel to the fastening area.

The rear side may have a resting area parallel to the fastening area.

The term "parallel" also refers to a relative arrangement between two areas or straights, for example, between the resting area and the fastening area with a slight deviation from exactly parallel arrangement, for example, at an angle of at most ten degrees, particularly of at most five degrees, to one another.

In particular, the resting area is formed as an area on which the housing rests when the semiconductor chip is fastened in the housing. Viewed along a normal to the fastening area, the fastening area and the resting area are preferably overlapping at least sectionally.

The housing may have a front side and a rear side opposite the front side, wherein the front side comprises a fastening area for the semiconductor chip. The rear side has a mounting area to mount the housing, the mounting area running obliquely to the fastening area. The rear side comprises a resting area running parallel to the fastening area.

Due to the fastening area running obliquely to the mounting area, a semiconductor chip fastened to the fastening area and radiating perpendicularly to the fastening area mainly radiates at an angle which is oblique to the mounting area. In other words, a main radiation direction of a semiconductor component having such a housing and a semiconductor chip is neither parallel nor perpendicular to the mounting area. In particular, tilting the main radiation direction relative to a normal to the mounting area corresponds to the angle between the mounting area and the fastening area. As a result, the main radiation direction can be adjusted by the angle between the mounting area and the fastening area when producing the housing in a simple and reliable manner.

Correspondingly, this applies analogously to a semiconductor chip provided for radiation detection. In particular, a main detection direction of a semiconductor chip provided for radiation detection runs neither parallel nor perpendicular to the mounting area.

Furthermore, the housing may rest on the resting area on the rear side, for example, on a mount to fasten the semiconductor chip to the fastening area so that the fastening area runs parallel to the front side of the mount facing the housing. As a result, fastening of the semiconductor chip and electrical contacting thereof, for example, by a wire bond connection and, if required, a subsequent encapsulation of the semiconductor chip by a molding mass are simplified.

Furthermore, this achieves oblique radiation without that, particularly additionally to the housing, optical elements downstream of the semiconductor chip are required. As a result, costs and production effort as well as construction space of the component can be reduced.

The mounting area may be arranged at an angle of 10° to 80° to the fastening area. For example, the angle is 15°, 30°, 45° or 60°. As a result, the tilting degree of the main radiation direction can be adjusted relative to the normal of the mounting area by adjustment of the angle already when producing the housing.

The mounting area may comprise a first contact region and a second contact region spaced from the first contact region. The first contact region and the second contact region are each provided for the external electric contacting of the housing.

In a semiconductor component having such a housing, the first contact region and the second contact region each connect to a contact of the semiconductor chip so that by applying an external electric voltage between the first contact region and the second contact region charge carriers can be injected from different sides into an active region provided for generation of radiation, recombining there while emitting radiation.

In particular, the first contact region and the second contact region are in a common plane spanned by the mounting area so that the fastening area has the same angle to the first contact region as the second contact region.

A normal to the fastening area particularly running through a center of the fastening area may penetrate the resting area. In particular, the housing is sectionally limited along the normal by the mounting area and the resting area. In other words, the mounting area and the resting area are at least sectionally opposite to one another and overlap along the normal when viewed toward the housing.

The front side may comprise a wire bond reception area spaced from the fastening area and particularly running in parallel to the fastening area. The wire bond reception area and the fastening area may be arranged in one plane or offset to one another. The wire bond reception side is particularly configured such that a connection line such as a bonding wire can be guided from the semiconductor chip to the wire bond reception side or vice versa for the electrical contacting of a semiconductor chip arranged in the housing.

Thus, the wire bond reception area is also parallel to the resting area. When the housing rests on a mount with the resting area, the wire bond reception side also runs parallel to the front side of the mount. As a result, production of a wire bond connection is simplified.

The front side may have a cavity that receives the semiconductor chip, with the fastening area being a bottom area of the cavity. The side surfaces of the cavity can in particular be configured to be reflecting for radiation in the infrared, visible and/or ultraviolet spectral range, for example, with a reflectivity of at least 50%.

Furthermore, the cavity may serve for protection of the semiconductor chip against a mechanical load due to a shock or a touch of the front side of the housing, for example.

The front side may have a reception area running parallel to the mounting area. In particular, the mounting area is provided for the reception of the housing, for example, of a packing in which the housing is arranged. Despite the fastening area running obliquely to the mounting area, the front side thus comprises a partial region running parallel to the mounting area and simplifying reception of the housing.

The rear side may comprise a connection area connecting the mounting area to the rest. In particular, the connection area runs obliquely to the mounting area and/or obliquely to the resting area. A housing with a connection area oriented in such a fashion can be produced by a casting method in a simple manner. For example, the connection area has an internal angle of at least 91° to the mounting area. Further, the connection area forms an internal angle of at most 269° to the resting area.

Herein, an angle inside the housing is referred to as internal angle.

The first contact region may be formed by a first contact layer. For example, the first contact layer runs from the first contact region to the front side of the housing. In particular, the first contact layer can be guided over a side area of the housing. As a side area of the housing is referred to an area of the housing, which limits the housing in a lateral direction running along the mounting area.

Analogously, the second contact region can be formed by a second contact layer, wherein the second contact layer can particularly be guided over a side area of the housing to the front side.

For example, a first contact area is formed on the front side for the electric contacting of the semiconductor chip by the first contact layer. The first connection area may overlap with the mounting area or be arranged laterally to mounting area.

A multitude of such housings may be arranged in a housing composite in which adjacent housings are formed in a connected manner. The housing composite can be individualized into single housings prior to or after the fastening of semiconductor chips in the housings. For example, the housing composite comprises a multitude of row-shaped regions in which the housings are arranged adjacent to one another. The individual, row-shaped regions can be formed parallel to one another and particularly at least sectionally spaced from one another.

A semiconductor component may comprise a housing having at least one of the above described features and particularly an optoelectronic semiconductor chip, which is fixed to the mounting area. A main radiation direction of the semiconductor chip, respectively a main detection direction in a radiation detector, runs perpendicular to the fastening area and obliquely to the mounting area of the housing.

A component arrangement may comprise at least one above described semiconductor component and a connection carrier, with the semiconductor component being fastened to the connection carrier with the side of the mounting area. For example, the first contact region of the housing connects to a first connection area of the connection carrier in an electrically conductive manner and the second contact region connects to a second connection area of the connection carrier in an electrically conductive manner.

To produce a semiconductor component, a housing can be provided with at least one of the above described features and arranged on a mount so that the housing rests on a resting area. The semiconductor chip is fastened to the fastening area. When fastening the semiconductor chip, the housing does thus not rest on the mounting area of the housing but on the resting area. As result, fastening of the semiconductor chip is simplified.

Further features, configurations and developments are indicated in the following description of the examples in conjunction with the figures.

Identical or similar elements or such with the same effect are furnished with the same reference numerals in the figures.

The figures and size ratios of the elements shown in the figures among one another should not be considered as to scale. Instead, individual elements may be shown in excessively large format for better visualization and/or better understanding.

FIG. 1A shows an example of a housing 1 in a schematic sectional view. FIG. 1B illustrates a component composite 9 in which a semiconductor component 7 having such a housing 1 and a semiconductor chip 8 is arranged in a connection carrier 91.

The housing has a front side 2 with a fastening area 21 provided for the fastening of a semiconductor chip. In this example, the fastening area is formed as a bottom area 250 of a cavity 25. The cavity is provided to receive the semiconductor chip.

A mounting area 31 is formed on a rear side 3 opposite the front side. The mounting area is provided to fasten the housing to the connection carrier.

The mounting area 31 has a first contact region 311 and a second contact region 312. The contact regions are laterally spaced from one another and provided for electrical contacting of the housing 1. The first contact region and the second contact region extend in a common plane.

The rear side 3 has a resting area 35. The resting area runs parallel to the fastening area 21. The fastening area 21 and the resting area 35 thus run obliquely to the mounting area 31. The angle formed between the mounting area and the fastening area can be varied in large limits. Preferably, the angle is 10° to 80°.

The resting area 35 is arranged between the first contact region 311 and the second contact region 312. The fastening area and the resting area overlap when viewed toward the housing along a normal 210 to the fastening area 21. As described below, fastening of a semiconductor chip in the housing and mounting the housing on a connection carrier are simplified. However, a different configuration of the resting area is possible as long as the resting area runs parallel to the fastening area.

The housing 1 is limited by side areas 4 in the lateral direction. A vertical extension of the side area 4 adjacent to the first contact region 311, illustrated by arrow 19, is greater than a vertical extension of the housing in the region of the side area adjacent to the second contact region 312, illustrated by arrow 18. The greater the difference between the heights, the greater can be the angle between the mounting area and the fastening area. For example, the height of the housing on the side facing the first contact region is at least 1.2 times as high as the height in the region of the second contact region 312.

The first contact region 311 is formed by a first contact layer 51. The first contact layer 51 runs over the side area 4 to the front side 2 of the housing. The first contact layer forms a first connection area 61 for the semiconductor chip on the fastening area 21. Such configuration of the first connection area is particularly suitable for semiconductor chips in which a contact is located on the side of the semiconductor chip facing the housing. In a semiconductor chip in which both contacts are arranged on the side facing away from the housing, the first connection area may also be formed spaced apart from fastening area 21. In this case, the fastening area can also be free from the first contact layer.

The second contact region 312 is formed by a second contact layer 52. The second contact layer 52 runs over a side area 4 to the front side 2 of the housing and forms a second connection area 62 there. The second connection area is arranged in the region of a wire bond reception area 22. The wire bond reception area runs parallel to the fastening area 21 and is provided for electrical contacting of the semiconductor chip by a wire bond connection. As illustrated in FIG. 1B, a connection line 71, for example, a wire bond connection, extends from the second connection area 62 to the semiconductor chip 8. On the contrary, a housing provided for the fastening of a semiconductor chip with two contacts on the side facing away from the housing may also have more than one wire bond reception area, for example, two wire bond reception areas 22. The wire bond reception area is arranged offset to the fastening area along a normal 210 to the fastening area 21. As a result, relatively large tilting of the main radiation direction can be simultaneously achieved with a little maximum vertical extension of the housing. In contrast, the wire bond reception area 22 may also be in one plane with the fastening area 21.

Alternatively, the second connection area 62 and the first connection area 61 can be arranged in the fastening area 21. Such configuration is particularly suitable for a semiconductor chip having two contacts on a rear side facing the housing. In this case, a wire bond reception area may be omitted.

Furthermore, the front side 2 comprises a reception area 23 running parallel to the mounting area 31. Housings arranged as in FIG. 3B in a packing 95 such that the mounting area rests in the packing can thus be removed from the packing by conventional reception tools in a simple and reliable manner. Despite the oblique fastening area, the housing thus provides a reception area parallel to the mounting area on the front side. The areas running in parallel and decisive for mounting the housing 1 are illustrated by lines 27.

Furthermore, the rear side comprises a connection area 32 running between the mounting area 31 and the resting area 35.

Preferably, the connection area runs obliquely to the mounting area 31 and/or obliquely to the resting area 35. Preferably, the connection area forms an obtuse angle with the mounting area of at least 91° and with the resting area 35 an internal angle of at least 181° and at most 269°. Thus, a shaped body 15 of the housing 1 can be produced by a casting method in a particularly simple manner.

FIG. 2A shows an example of a casting mold with a first part 151 and a second part 152. Viewed from a boundary region 153 between the first part and the second part, the first part and the second part are shaped such that recesses taper along with an increasing distance to the boundary area. As a result, the housing can easily and reliably be removed from the first part 151 and the second part 152. The first part 151 determines the shape of the front side 2, the second part 152 determines the shape of the rear side 3. The boundary area 153 runs through a first edge 16, at which the side area 4 and the second contact region 312 encounter one another, and through an edge, at which the side area 4 and the reception area 23 encounter one another.

Injection molding is particularly suitable for production of the shaped body 15. However, a different casting method, in particular one of the above mentioned casting methods, can be applied.

Subsequently, the shaped bodies 15 can be provided with the first contact layer 51 and the second contact layer 52. The terms first contact layer and second contact layer do not mean that the layers are produced in subsequent steps. These layers can rather be partial regions in a layer produced in a common production step, wherein an initially continuous layer is divided into the first contact layer and the second contact layer. A laser ablation method may be used to that end, for example.

Figure 2B:
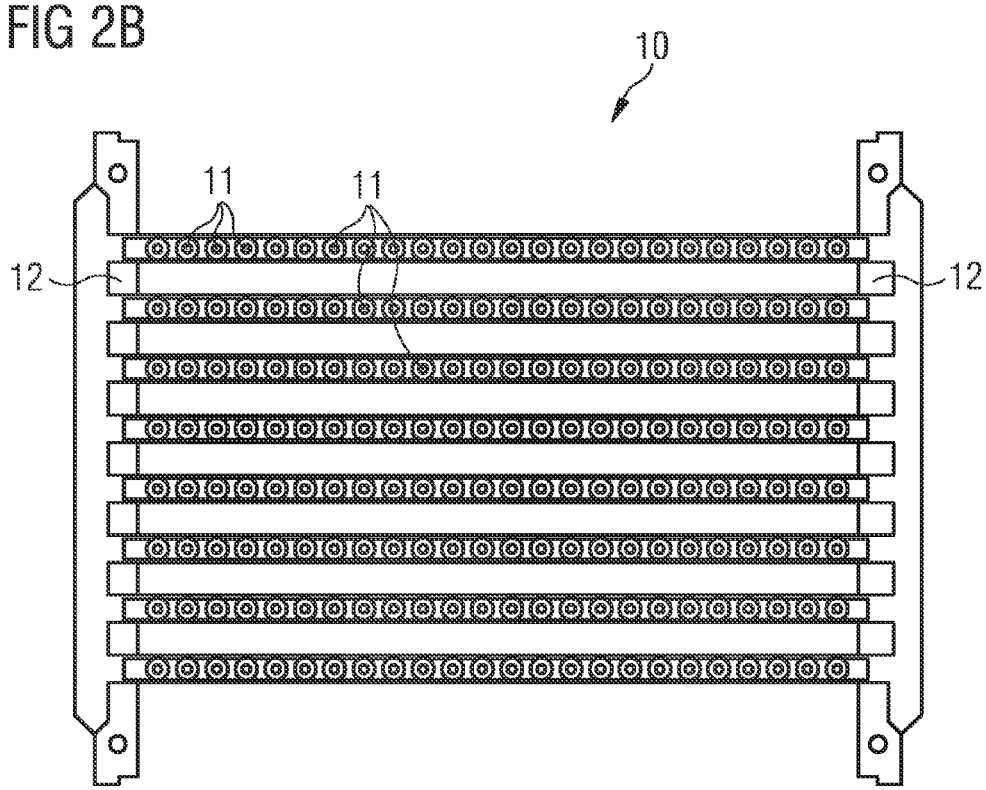
FIG. 2B shows an example of a housing composite in a schematic plan view.

The housings 1 can also be provided in a housing composite. One example of a housing composite 10 is shown in a schematic top view in FIG. 2B. The housings 1 are arranged adjacent to one another in a multitude of row-shaped regions 11. The row-shaped regions 11 are spaced from one another in a direction transversely to a main extension direction of the row-shaped regions 11. The row-shaped regions connect to one another by connection webs 12 at the ends of the row-shaped regions. The composite provided that way can be singulated prior to or after furnishing the housings 1 with semiconductor chips 8.

Figure 3A:
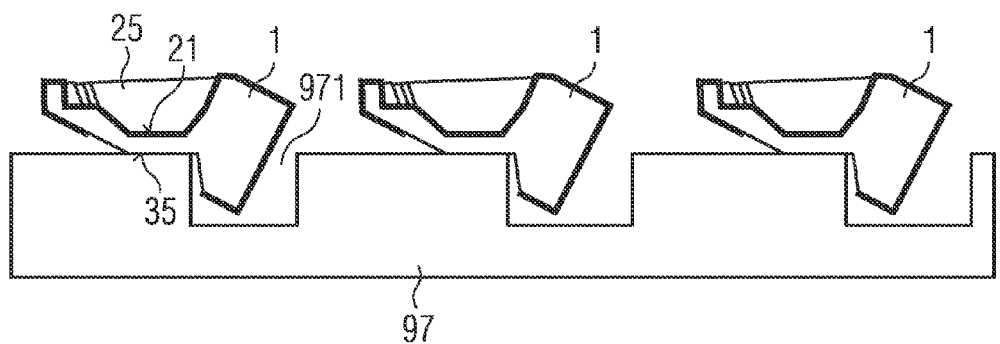
FIG. 3A shows an intermediate step of a method of producing a semiconductor component in a schematic sectional view.
Figure 3B:
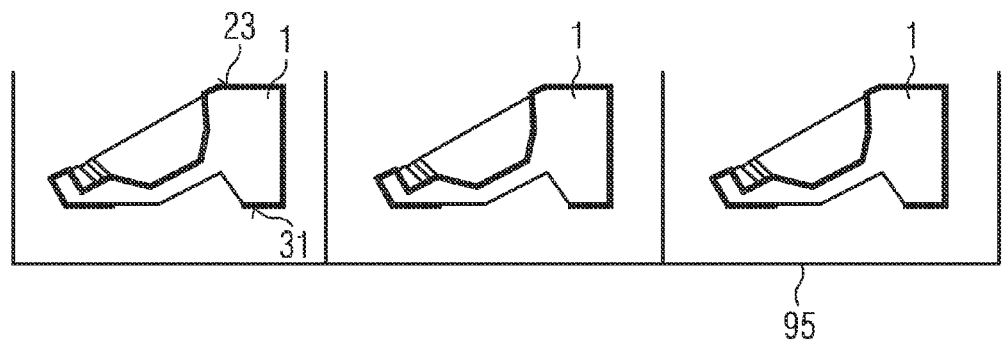
FIG. 3B shows an example of a housing arranged in a packing.

As illustrated in FIG. 3A, to produce semiconductor components 7, the housings 1 may be arranged on a mount 97 such that the housings 1 rest on a front side 970 of the mount 97 with the support area 35. The mount 97 comprises recesses 971 on the front side 970 which project into the housings 1.

When supporting the housing 1 on the reception area 35 in such a way, the fastening area 21 and the wire bond reception area 22 run parallel to the front side 970 of mount 97 so that the placement of the semiconductor chip and production of an electrically conductive connection by wire bonding as well as at least a sectional filling of the cavity 25 with a molding mass, if required, to encapsulate the semiconductor chip can be effected analogously to production of conventional surface-mounted semiconductor components.

The areas running in parallel to one another and being decisive for the fastening of the semiconductor chip are illustrated in FIG. 1A by lines 26.

A semiconductor component 7 produced this way is shown in FIG. 1B. Arrows 81 illustrate the course of the radiation emitted during operation of the semiconductor component 7. A main radiation direction 80 of a radiation generated in an active region 85 of the semiconductor chip 8 runs perpendicular to a main extension plane of the active region. In turn, the main extension plane of the active region runs parallel to the fastening area 21 so that the main radiation direction of the semiconductor component 7 runs obliquely to the mounting area 31 and thus obliquely to the connection carrier 91. The angle of the main extension direction 80 to the normal of the connection carrier 91 corresponds to the angle between the mounting area 31 and the fastening area 21 and can thus be adjusted in a simple and reliable manner already during the production of the housing 1.

The semiconductor component may also be provided for the detection of radiation. To that end, the active region may be provided for detection of radiation. For example, the semiconductor chip is a photodiode. Accordingly, the above explanations apply analogously, with the main detection direction running congruently to the above main extension direction, however antiparallel.

The semiconductor component 7 is a surface-mountable semiconductor component in which the first contact region 311 and the second contact region 312 connect to a first connection area 911 or a second connection area 912, for example, by solder or an electrically conductive adhesion layer, when mounting the semiconductor component to the connection carrier 91.

This application claims priority of DE 10 2013 113 009.7, the subject matter of which is incorporated herein by reference.

Our housings, composites, components and methods are not limited to the examples based on the description thereof. Rather, this disclosure encompasses every new feature as well as every combination of features, which particularly includes every combination of features in the appended claims, even if such feature or combination is not explicitly stated in the claims or examples.

The invention claimed is:

1. A semiconductor component comprising a housing and a semiconductor chip,
wherein
the semiconductor chip is an optoelectronic semiconductor chip that generates radiation having a main radiation direction or receives radiation having a main detection direction;
the housing has a front side and a rear side opposite the front side;
the front side has a fastening area, the semiconductor chip being fastened to the fastening area;
the rear side has a mounting area to mount the housing, wherein the mounting area runs oblique to the fastening area;
the rear side has a resting area running parallel to the fastening area; and
the main radiation direction or the main detection direction of the semiconductor chip runs perpendicular to the fastening area and oblique to the mounting area.

2. The semiconductor component according to claim 1, wherein the mounting area is arranged at an angle of 10° to 80° to the fastening area.

3. The semiconductor component according to claim 1, wherein the mounting area has a first contact region and a second contact region spaced from the first contact region to electrically contact the housing.

4. The semiconductor component according to claim 3, wherein the resting area is arranged between the first contact region and the second contact region in a plan view onto the housing.

5. The semiconductor component according to claim 1, wherein the fastening area and the resting area at least sectionally overlap viewed along a normal to the fastening area.

6. The semiconductor component according to claim 1, wherein the front side has a wire bond reception area spaced from the fastening area and running parallel to the fastening area.

7. The semiconductor component according to claim 1, wherein the front side has a cavity that receives the semiconductor chips, and the fastening area is a bottom area of the cavity.

8. The semiconductor component according to claim 1, wherein the front side has a reception area running parallel to the mounting area.

9. The semiconductor component according to claim 1, wherein the rear side comprises a connection area connecting the mounting area to the resting area, and the connection area runs obliquely to the mounting area and obliquely to the resting area.

10. The semiconductor component according to claim 1, wherein the first contact region is formed by a first contact layer guided by the first contact area to the front side of the housing.

11. The semiconductor component according to claim 1, having a plurality of housings in which adjacent housings are connectedly formed.

12. The semiconductor component according to claim 1, wherein the semiconductor chip is an optoelectronic semiconductor chip for generation or reception of radiation.

13. A component composite comprising at least one semiconductor component according to claim 12 and a connection carrier, wherein the semiconductor component is fastened to the connection carrier on the side of the mounting area.

14. A method of producing the semiconductor component according to claim 1 comprising:
 a) providing the housing;
 b) arranging the housing on a mount so that the housing rests on the resting area; and
 c) fastening the semiconductor chip to the fastening area.

15. The semiconductor component according to claim 1, wherein the mounting area comprises a first contact region and a second contact region spaced from the first contact region, the first contact region and the second contact region each provided for the external electric contacting of the housing, and wherein the first contact region is formed by a first contact layer, the first contact layer being guided over a side area of the housing to the front side.

* * * * *